US009917604B1

United States Patent
Jorgovanovic et al.

(10) Patent No.: US 9,917,604 B1
(45) Date of Patent: Mar. 13, 2018

(54) DYNAMIC RECEIVE SENSITIVITY (71) Applicant: Amazon Technologies, Inc., Seattle, WA (US)

(72) Inventors: Milos Jorgovanovic, Santa Clara, CA (US); Pratik Kalpesh Patel, Sunnyvale, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 15/080,024

(22) Filed: Mar. 24, 2016

(51) Int. Cl.
    H04B 1/10 (2006.01)
    H03F 3/19 (2006.01)
    H03G 3/30 (2006.01)

(52) U.S. Cl.
    CPC ............ H04B 1/109 (2013.01); H03F 3/19 (2013.01); H03G 3/3042 (2013.01); H03F 2200/294 (2013.01); H03F 2200/333 (2013.01); H03F 2200/451 (2013.01); H04B 1/1027 (2013.01)

(58) Field of Classification Search
    CPC ......... H04B 1/10; H04B 1/1027; H04B 1/109
    USPC ........ 455/226.1, 226.2, 250.1, 254, 296, 311
    See application file for complete search history.

(56) References Cited

U.S. PATENT DOCUMENTS

| 5,321,851 | A * | 6/1994 | Sugayama | H03J 7/285 455/161.3 |
| 5,884,194 | A * | 3/1999 | Shiraki | H04M 9/082 370/289 |
| 6,671,331 | B1 * | 12/2003 | Sakuma | H04B 17/309 375/316 |
| 6,718,166 | B2 * | 4/2004 | Cordone | H04B 1/1027 375/E1.021 |
| 7,103,316 | B1 * | 9/2006 | Hall | H04B 17/318 455/226.2 |
| 2002/0173341 | A1 * | 11/2002 | Abdelmonem | H04B 1/1036 455/561 |
| 2007/0197178 | A1 * | 8/2007 | Gu | H03G 11/002 455/232.1 |
| 2012/0033766 | A1 * | 2/2012 | Hosokawa | H04B 1/0032 375/340 |
| 2013/0308731 | A1 * | 11/2013 | Hsin | H04B 1/10 375/345 |
| 2014/0062664 | A1 * | 3/2014 | Gudan | G06K 7/10207 340/10.1 |
| 2015/0119062 | A1 * | 4/2015 | Aoki | H04W 72/082 455/452.1 |
| 2015/0381221 | A1 * | 12/2015 | Cyzs | H04B 1/7097 375/346 |
| 2016/0277050 | A1 * | 9/2016 | Kato | H04B 7/08 |

* cited by examiner

Primary Examiner — Duc M Nguyen
(74) Attorney, Agent, or Firm — Pierce Atwood LLP (57) ABSTRACT

A wireless communication device may reduce a receive sensitivity in the face of a high number of interfering communications to improve uplink throughput. In a listen-before-talk scenario, a device detecting a large number of undesired received communications may not transmit uplink data in the face of crowded traffic conditions. To avoid this scenario, if a desired communication link has a sufficiently high RSSI, a device may reduce its receive sensitivity to reduce the number of detected undesired communications while maintaining sufficient quality of the desired communication link. This approach will increase uplink throughput and improve communication performance.

19 Claims, 8 Drawing Sheets

Device 102 Setting
Rx Sensitivity = -57dB

| Device | Signal Strength (RSSI in dB) |
|---|---|
| 104e | -40 |
| 106 | -50 |
| AP 110 | -55 |
| 104a | -55 |

DYNAMIC RECEIVE SENSITIVITY

BACKGROUND

With the advancement of technology, the use and popularity of electronic devices has increased considerably. Electronic devices are commonly used to wirelessly connect to networks using network devices such as access points.

BRIEF DESCRIPTION OF DRAWINGS

For a more complete understanding of the present disclosure, reference is now made to the following description taken in conjunction with the accompanying drawings.

DETAILED DESCRIPTION

Wireless communication devices are ubiquitous. While the spread of these devices has allowed unprecedented numbers of users access to communication, information, and entertainment, it has also led to a number of problems regarding how such devices can co-exist within one or more communication networks. While many solutions exist to control the behavior of such devices in a way that allows general interoperability, problems remain.

One such problem involves how neighboring devices impact the ability of an individual device to receive communications. In particular, if a first device is configured to have high receiver sensitivity (thus allowing the first device to process weak incoming signals from a desired transmitter) it will also recognize more potentially interfering signals from neighboring transmitters that are not part of (i.e., sent over) a desired communication link with the first device. Such potentially interfering signals can interfere with efficient operation of the first device.

Offered is a solution to the problem of a high receive sensitivity device receiving potentially interfering received signals. An operating device may monitor the signal strength of a desired received signal. As the desired signal strength increases, the device may lower its receive sensitivity, thus ignoring weaker undesired signals. This process may occur dynamically, and in a loop fashion, so that the device maintains a balance between ensuring it can receive the desired signal and it is not interfered with by undesired signals.

Figure 1:
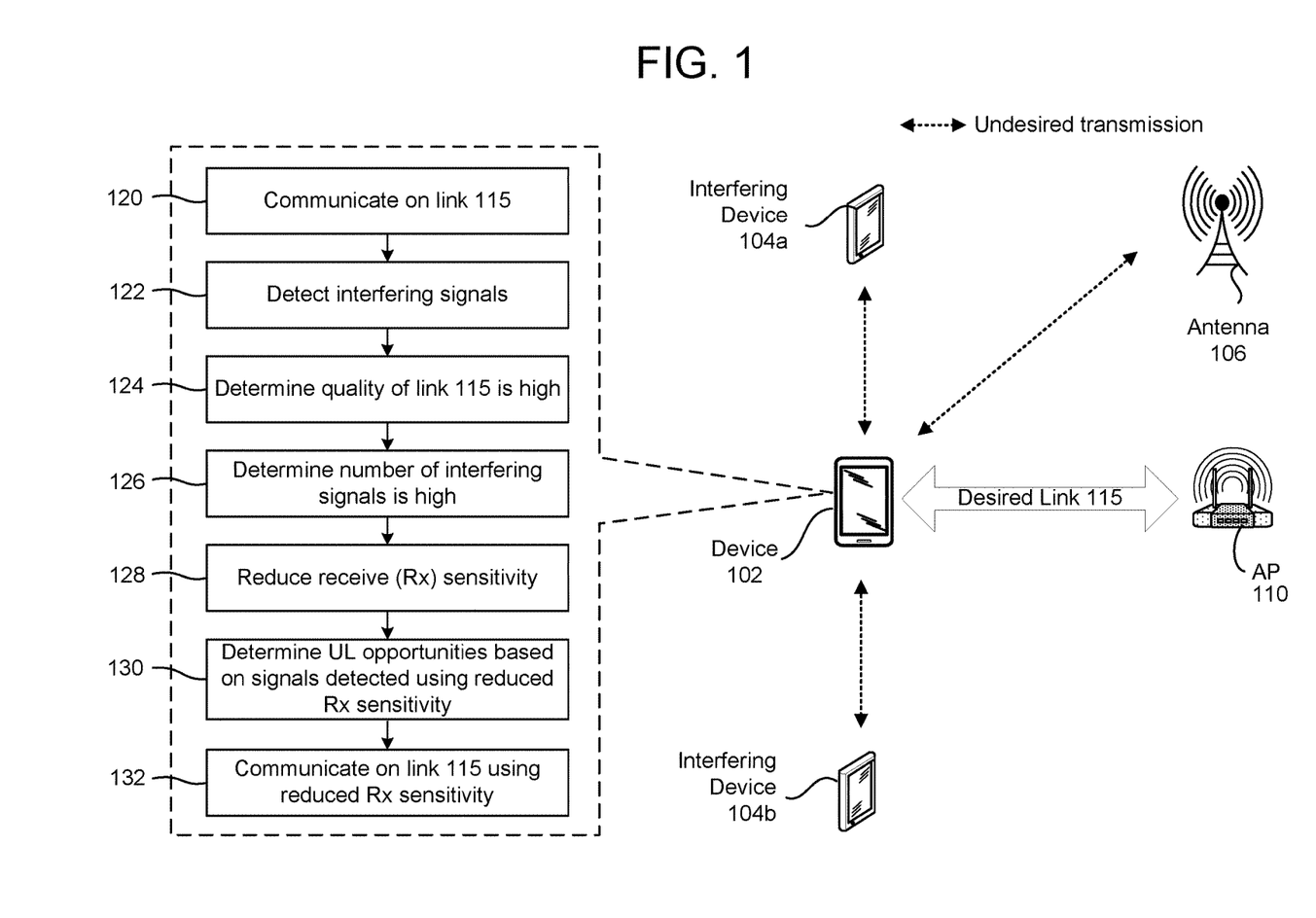
FIG. 1 illustrates a system for dynamically adjusting receive sensitivity for communicating on a wireless network according to embodiments of the present disclosure.

An illustration of such operation is illustrated in FIG. 1. As shown in FIG. 1, a device 102 communicates (120) with a second device, such as an access point (AP) 110 over a desired communication link 115. The communication link 115 is a connection across which the device 102 and AP 110 may exchange data. The communications over link 115 may occur over a particular frequency range. As part of scheduling communications from the device 102 to the AP 110, the device 102 may engage in a "listen-before-talk" (LBT) operation to detect (122) interfering signals that may be operating in the particular frequency range. The interfering signals may be coming from any number of different interfering mobile devices (104a, 104b), stationary devices such as antenna 106, or other devices. The antenna 106 may represent a communication hub a such as cellular tower, base station, node B, evolved node B (eNodeB), or other access point. The antenna may also represent a macro cell, pico cell, femto cell or other type of cell.

If there are a large number of such interfering signals, the device may have difficulty scheduling uplink communications from the device 102 to the AP 110. The device 102 may determine (124) that the quality of desired link 115 is high and may also determine (126) that the number of detected interfering signals is also high. The device 102 may then reduce (128) its receive (Rx) sensitivity so that it will reduce the number of detected interfering signals. The device 102 may then determine (130) uplink (UL) opportunities based on interfering signals detected using the reduced Rx sensitivity. The device 102 may then communicate (132) on link 115 with the AP using the reduced Rx sensitivity.

The first device 102 and/or second device (illustrated as AP 110) may actually be stationary or mobile, but may avail itself of the techniques disclosed herein to manage wireless communications. Examples of a stationary device may include a personal computer, router, fixed wireless access point, or the like. Examples of a mobile device may include a cellular phone, a personal digital assistant (PDA), a wireless modem, a wireless communication device, a hand-held device, a laptop computer, a cordless phone, a wireless local loop (WLL) station, a tablet, remote control, gaming control, voice operated device or the like.

By way of background, in order for a communication link to be effective it requires both effective downlink communications (communications from a communication hub, such as a cellular tower, network access point (AP), etc. to a mobile device) and effective uplink communications (communications from the mobile device to the communication hub). In a multiple-access network, a single hub may be capable of supporting multiple user mobile devices by sharing the available network resources. To manage communications among multiple mobile device simultaneously, the hub may give instructions to individual mobile devices as how best to communicate with the hub.

To do so a hub may use multiple channels (i.e., frequencies), timing configurations, or other configurations. For example, a hub may use a shared channel to indicate to multiple different devices what data channel each device should for uplink or downlink communications. For example, a hub may assign a first channel to a first device for uplink communications (i.e., what channel the first device should use to send communications to the hub) and a second channel to the first device for downlink communications (i.e., what channel the first device should monitor to receive communications from the hub). At the same time the hub may assign a third channel to a second device for uplink communications and a fourth channel to the second device for downlink communications. Such an arrangement may be considered a frequency-division multiplexed (FDM) configuration, that is, a communication configuration that manages communications by assigning different frequencies for different communications for different devices.

Alternatively (or in addition) the hub may assign certain times for each mobile device to send or receive communications. Such an arrangement may be considered a time-division multiplexed (TDM) configuration, that is, a communication configuration that manages communications by assigning different times for different communications for different devices. Other communication configurations are also possible, including code-divided communications, where each communication has a code assigned to it, and each device only processes communications that have the particular device's assigned code. These various techniques (and others) are also combined, resulting in a wide variety of methods in which communication networks manage communications among multiple devices. Examples of wireless networks that employ a variety of communication management techniques include Code Division Multiple Access (CDMA) networks, Time Division Multiple Access (TDMA) networks, Frequency Division Multiple Access (FDMA) networks, Orthogonal FDMA (OFDMA) networks, and Single-Carrier FDMA (SC-FDMA) networks. Further the techniques may be used by other networks such as a wireless local area network (WLAN).

As can be appreciated, the strength of wireless signals can greatly impact the quality of a communication link (i.e., a communication connection between two devices). Transmit strength impacts how far a transmitted signal is sent. Similarly, receive sensitivity impacts how strong a received signal needs to be before a receiving device can process it. Many devices, in order to improve their communication range (i.e., operable distance a first device may maintain between it and a partner device on the other end of a link), are designed to have a high receive sensitivity. A higher receive sensitivity allows a device to operate a greater distance from a partner device (which may be a communication hub as discussed above). A high receive sensitivity may also allow the communication link to be more robust to varying environmental conditions, channel errors, etc. Further, to allow for varying communication conditions, a receive sensitivity may be set higher than is typically needed (for example 12-13 dB) to account for such link quality variations. The extra sensitivity (sometimes referred to as headroom) allows for good downlink receive performance and extended operating range.

In certain circumstances, however, high receive sensitivity may result in poor communication performance. Specifically, while having a high receive sensitivity may allow a device to travel farther from an access point, it also allows a device to receive more neighboring signals that are not part of/sent over a desired communication link. For example, communication signals from devices 104a and 104b discussed above in reference to FIG. 1, are undesired from the vantage of device 102.

In certain multiple-access schemes, particularly those that manage communications for multiple devices within a certain frequency range, certain techniques are used to determine which device communicates using the particular frequency range (which may include a single frequency channel). One technique for managing such communications is called listen-before-talk (LBT). An LBT scheme allows multiple devices to communicate without as much hands-on management by a hub to assign uplink or downlink slots, shared or data channels, etc. (though LBT may be used in combination with such schemes). LBT may be used with a number of different wireless technologies where multiple users share the transport medium (i.e., frequency range). For example, CSMA (carrier sense multiple access) calls for LBT operation. Under LBT, a device wishing to transmit uplink (UL) data may scan a desired frequency range corresponding to a desired communication link to detect if any other devices are communicating in the desired frequency range. In particular, a device (such as device 102) may detect a received signal, process it to determine if the received signal is intended for device 102, and if not, the device 102 may consider the device an undesired and potentially interfering signal. The larger number of detected interfering signals (also known as carrier sense occurrences (CSOs)), the fewer opportunities there are for the device 102 to transmit UL data. Thus, too many interfering neighboring signals may preempt a device's attempt to transmit, thus causing degradation on the uplink communications of the desired link. If there are too many CSOs, the device 102 may be unable to determine an UL transmit opportunity, which may result in a large amount of buffered UL data, higher link latency (i.e., delay), reduced link throughput (i.e., data transfer rate), or the like. Too much buffered UL data (or too much delayed UL data in time sensitive situations, such as a voice call) may result in call drop/disabling the desired communication link 115.

Offered is a technique by which a device 102 may be configured not to detect certain interfering signals by lowering its receive (Rx) sensitivity, thus lowering the CSOs, thus allowing the device 102 to transmit UL data in a timely manner. Specifically, a wireless communication device may reduce a receive sensitivity in the face of a congested airtime environment (high number of interfering communications) to improve uplink throughput. In a listen-before-talk scenario, a device detecting a large number of undesired received communications may not transmit uplink data in the face of crowded traffic conditions. To avoid this scenario, if a desired communication link has a sufficiently high received signal strength indication (RSSI), a device may reduce its receive sensitivity to reduce the number of detected undesired communications while maintaining sufficient quality of the desired communication link. While downlink performance of the link 115 may be slightly impacted, any negative impact to the link 115 caused by downlink degradation from a reduced Rx sensitivity may be made up for in improved uplink transmit performance. This approach will increase uplink throughput and improve communication performance.

Figure 2:
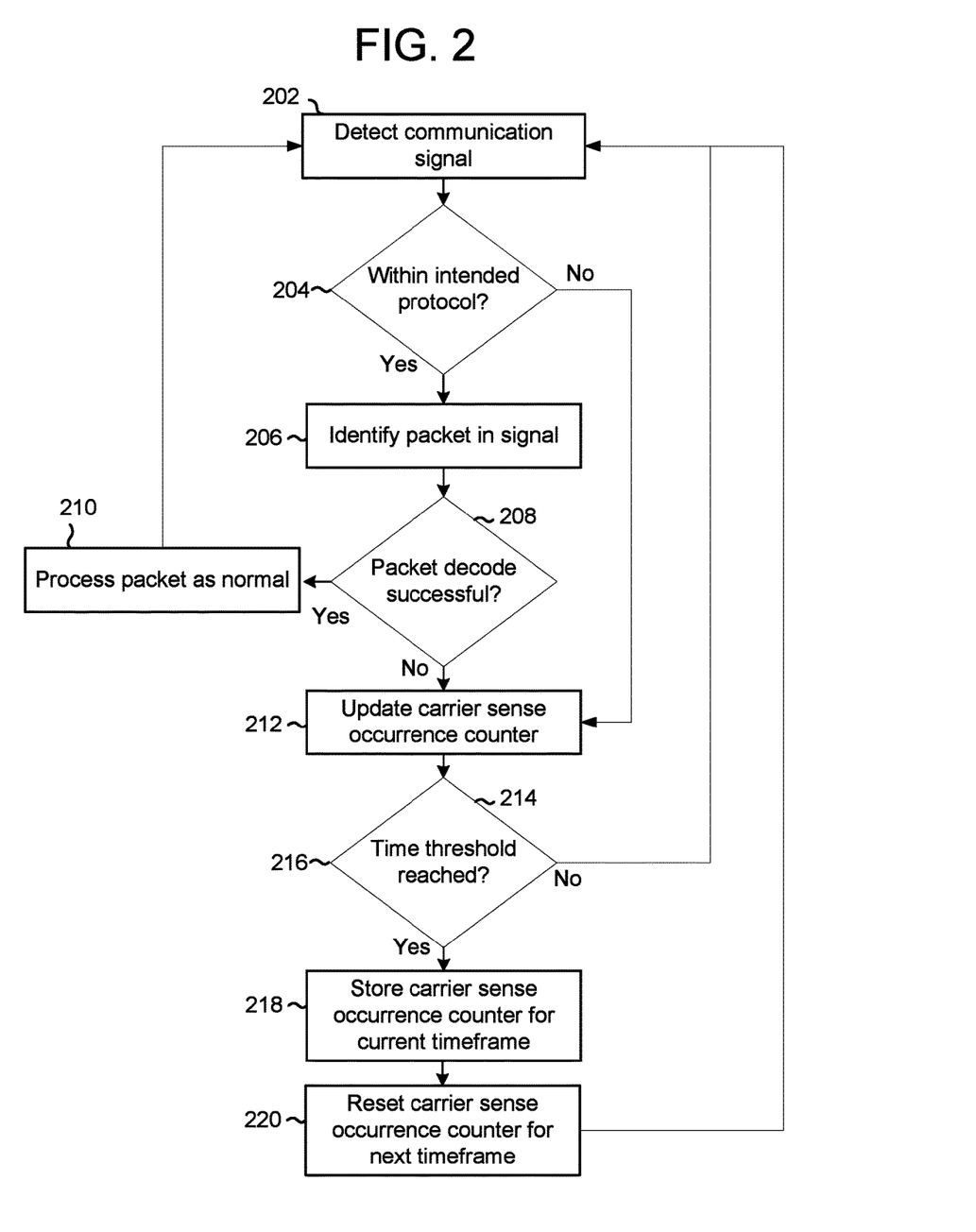
FIG. 2 illustrates a flowchart for determining potentially interfering communications according to embodiments of the present disclosure.

Carrier sense (i.e., detection of wireless signals) may be performed as illustrated in FIG. 2. A device 102 may detect (202) a communication signal. The detection may be done using a first (e.g., default) Rx sensitivity of the device 102. Thus, any signals that arrive at the device 102 with a strength above the Rx sensitivity will be detected by the device 102 and any signals that arrive at the device 102 with a strength below the Rx sensitivity will not be detected by the device 102. The device 102 may then determine whether (204) the detected communication signal is within a protocol for communications intended for device 102. For example, if device 102 is communicating (or attempting to communicate) using a desired link 115 that is using a wireless local area network (WLAN) connection, the device 102 will determine (204) if the detected signal is a WLAN signal. If the detected signal is within the desired protocol (204:Yes) the device 102 will identify (206) a data packet or other data form within the signal. The device 102 will then attempt to decode (208) the data packet (or otherwise process the data as if it was intended for device 102. If the packet decode is successful (208:Yes) the device will process (210) the packet as normal and continue communications and detection of incoming signals. If the packet decode is unsuccessful (208:No), the data is otherwise intended for a recipient other than device 102, or the detected signal is not within the intended protocol (204:No) the device 102 will update (212) a carrier sense occurrence counter or otherwise indicate that an interfering signal has been detected. A CSO counter may operate to track how many interfering signals are detected during a particular time window. As a new interfering signal is detected, the counter may be increased by 1. Although not illustrated in FIG. 2, the device 102 may also record some indication of the signal strength of each detected interfering signal as received by the device 102. This may be used to further evaluate whether to implement receive sensitivity backoff (i.e., reducing the receive sensitivity) or for other functions. Other techniques for tracking CSO (or network traffic congestion generally) may also be used.

The device 102 may then check (216) if a time threshold has been reached. If the threshold has not been reached (216:No) the device will continue to detect received signals as normal. If the time threshold has been reached (216:Yes) the device may store (218) a value of the CSO counter for the current timeframe. The timeframe for measuring CSOs may vary and is configurable. For example, a timeframe may be smaller where traffic congestion may change rapidly or may be longer where traffic congestion is less likely to fluctuate. When storing the value of the CSO counter (or other indication of network traffic) the device 102 may store the value with an associated timestamp or other indicator of the time window. For example, if the time window is from 0 to T, and the value of the CSO counter is N, the device 102 may store an indicator along the lines of [0-T; N]. Other such configurations are also possible. The device may then reset (220) the CSO counter in anticipation of the next timeframe and may then continue monitoring for signals as normal. As this process continues, the device 102 may store CSO indicators for different time windows. The device may continue to store these for a period of time until they are no longer useful, and may delete them or write over them as circumstances warrant.

Figure 3:
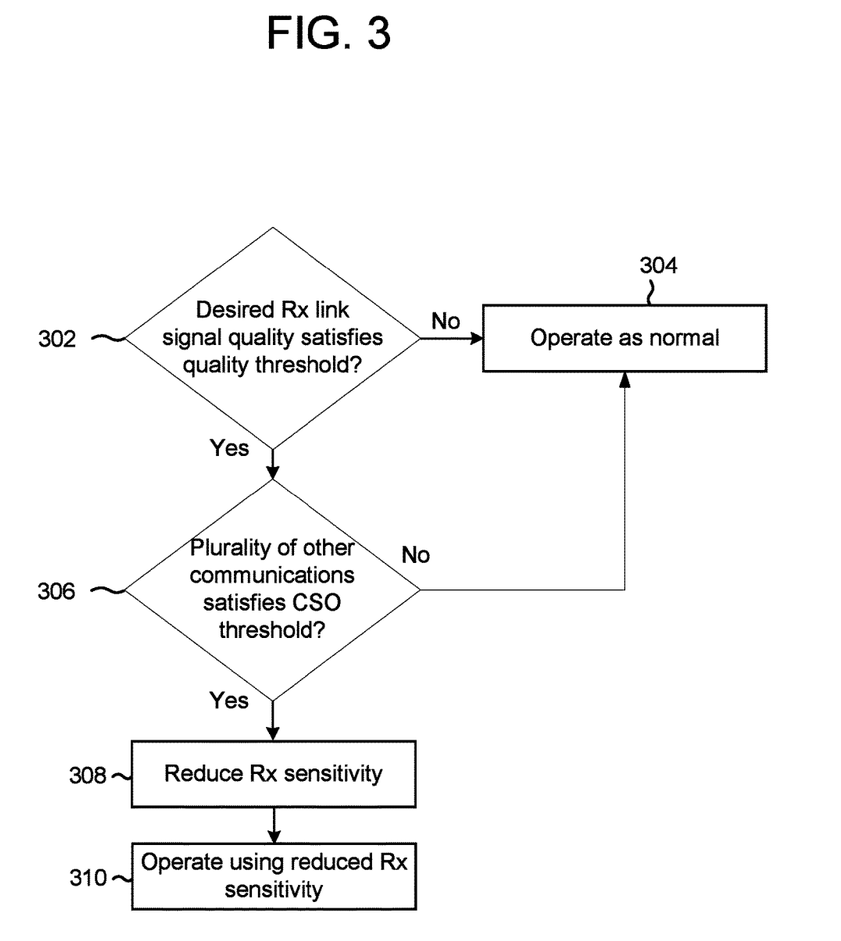
FIG. 3 illustrates a flowchart for dynamically adjusting a device's receive sensitivity according to embodiments of the present disclosure.

The device 102 may determine whether to activate receive (Rx) sensitivity backoff as illustrated in FIG. 3. The device 102 may determine (302) whether the desired link 115 has a sufficient received signal quality. That may include comparing a received signal strength indication (RSSI) value (which may be a single value, average value, or multiple values) satisfies a signal quality/signal strength threshold. The comparing can be determining the RSSI is above a threshold (if positive) or below a threshold (if negative) depending on system configuration. Effectively, the device is determining whether the received signal quality is sufficiently good to reduce the receive sensitivity of the device 102 (which will allow the device to ignore certain interfering signals but may also cause slight performance degradation of the communication link 115). Other measurements of received signal quality beyond signal strength may also be used. For example, the device may measure a throughput and compare the measured throughput to a threshold. The device may also measure a signal-to-noise ratio (SNR) and compare the SNR to a threshold. The device may also measure a signal-to-interference-and-noise ratio (SINR) and compare the SINR to a threshold. A variety of other techniques known in the art may be used to determine received signal quality of the desired link 115. Multiple measurements may also be combined to determine received signal quality. Appropriate thresholds may then be configured and used to compare against the respective measurement(s) of received signal quality.

If the received signal quality does not satisfy the threshold (302:No) the device may operate (304) as normal and may not adjust its Rx sensitivity. If the received signal quality of the desired link 115 does satisfy the signal quality threshold (302:Yes) the device 102 may determine (306) whether the plurality of other communications detected satisfies a CSO threshold. For example, the device may compare a CSO counter value for a previous time window to a threshold value. If the CSO counter value is above the threshold, the device 102 may determine that the threshold is satisfied (306:Yes). In another example, the device 102 may weight each detected interfering signal by a value dependent on the interfering signal's respective signal strength as received by device 102 (or the device 102 may otherwise use the respective signal strength(s) when making the threshold determination of 306. If the respective signal strength(s) are used, the threshold for 306 may be configured accordingly to account for such signal strength(s). If the threshold is satisfied (306), the device may reduce (308) its Rx sensitivity from a first value to a second, less sensitive value, and operate (310) (i.e., communicate on link 115) using the second, reduced, Rx sensitivity. The two checks illustrated in 302 and 306 may occur in any order. Further, while the figures described herein may use a certain order for illustration purposes, the steps may be carried out in any order depending on device configuration.

The signal quality metric (and corresponding threshold) may be based on received signal strength (as indicated by a signal strength indication (RSSI)), throughput, latency, or other metric of signal quality of communication link 115 between device 102 and intended AP 110. The signal quality value used to compare against a threshold may be a moving average of a signal quality, for example an average RSSI taken over a particular time window. For example, the device may calculate an RSSI average using Equation (1) below:

$$RSSI_{AVG}=(RSSI_N+RSSI_{N-1}+\ldots RSSI_{N-X})/X \qquad (1)$$

where the average RSSI ($RSSI_{AVG}$) is the average of the individual RSSI values at time N for the most recent X packets where X is the desired time window (which is configurable). For step 302, the device 102 may determine if $RSSI_{AVG}>RSSI_{Threshold}$. If yes (302:Yes), the device may continue checking to see if it should activate Rx sensitivity backoff. If no (302:No), the device may operate (304) as normal. As the device operates, it may update the value of $RSSI_{AVG}$ to be current through a recent time window.

Figure 6:
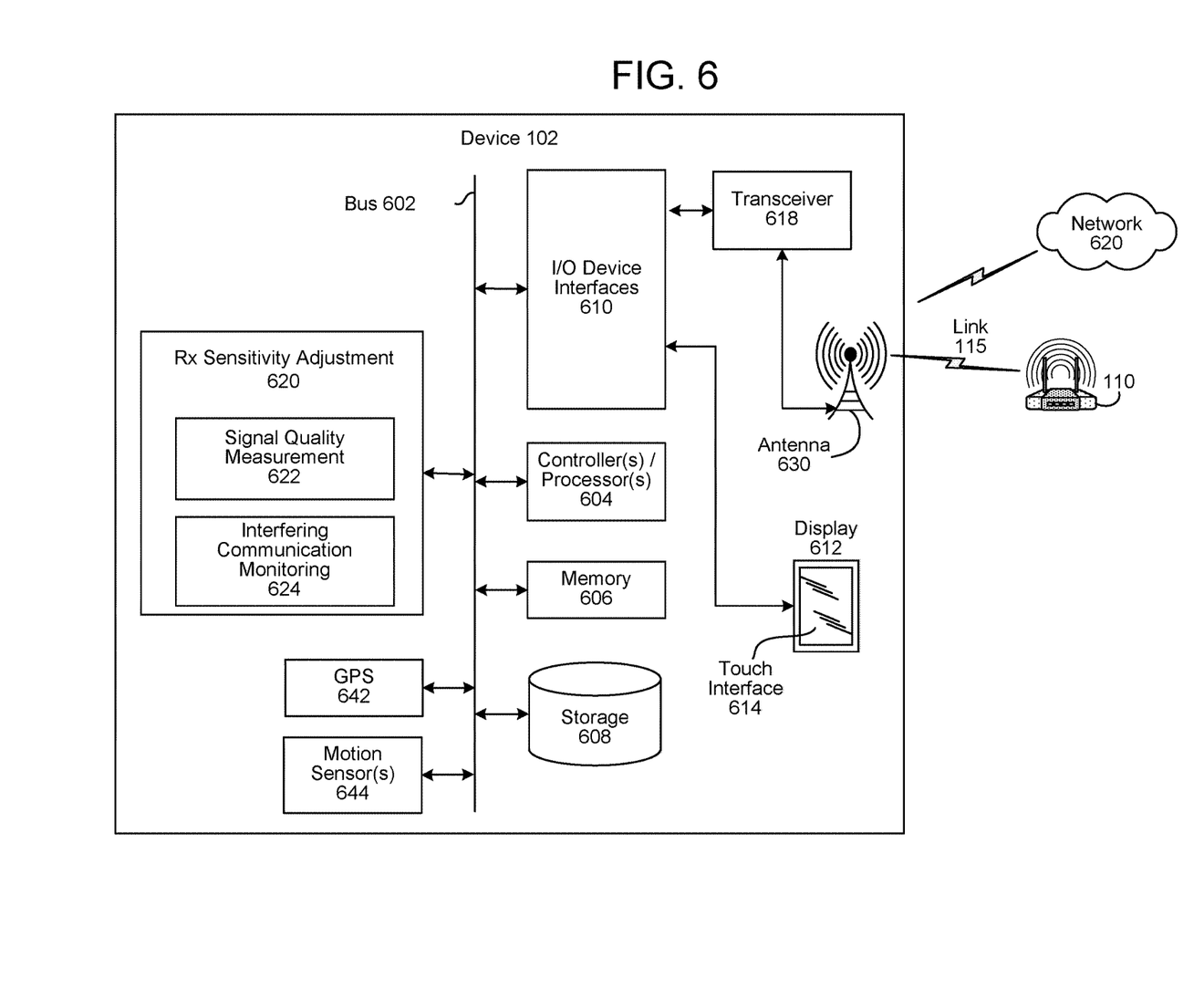
FIG. 6 is a block diagram conceptually illustrating example components of a device according to embodiments of the present disclosure.

The RSSI value may also be a weighted average, as illustrated in Equation (2) below:

$$RSSI_{AVG}=(W_N RSSI_N(W_N)W_{N-1}RSSI_{N-1}+\ldots W_{N-X}RSSI_{N-X})/X \qquad (2)$$

the weights W applied to each individual RSSI value may be configured by the device 102 and may change based on communication conditions. For example, if the device 102 is moving (as detected, for example, using GPS components 642, motion sensor(s) 644, or the like) the device 102 may more heavily weight the RSSI of recent packets over those of older packets, thus resulting in $W_N$ being higher than $W_{N-X}$. The difference between weighting may be linear, non-linear, or determined in a different fashion. Other different weighting schemes are possible.

The value of the threshold used in 302 (for example, $RSSI_{Threshold}$) is also configurable. For example, $RSSI_{Threshold}$ may be configured using a pre-configured default receive detection setting and a signal headroom margin. The pre-configured default receive detection setting may be a setting that is configured for the device for operation using the intended communication protocol. The signal headroom margin is any room between that pre-configured setting and the actual receive sensitivity of the device 102. An example headroom amount may be 12-20 dB. For example, the pre-configured setting may be a CSMA threshold plus a signal margin. In an example, the CSMA threshold may be −82 dB with a signal margin of 18 dB, thus leading to the pre-configured setting being −60 dB. Other such examples are possible. The CSMA threshold may be configured as part of a standard or other body and may be stored on the device 102 as a Rx sensitivity floor. The device 102 may be configured to operate using a first (for example, default) Rx sensitivity that is above the CSMA threshold, thus creating an operating margin for the device 102 to detect even weaker signals than the CSMA threshold would otherwise indicate.

The reduction in Rx sensitivity may occur by reducing some of the signal margin (i.e., headroom) from a first Rx sensitivity to achieve a second, less sensitive, Rx sensitivity. The reduction in Rx sensitivity may be accomplished by reducing an Rx gain ($G_{Rx}$) by a certain adjustment amount ($G_{Adj}$). The gain adjustment may be applied to a component of the device 102, for example an automatic gain controller (AGC), low noise amplifier, a baseband amplifier, a radio frequency (RF) amplifier, a digital amplifier, a number of different mixers (LNA, baseband, RF, etc.) or mixer of a device transceiver. The gain adjustment amount may be prescribed by a lookup table or other data stored on the device. The gain adjustment amount may also be based on various communication conditions. For example, if the first Rx sensitivity is set to a certain first amount, the RSSI of the desired link 115 is at a certain level, and there is a specific number (and/or strength) of interfering signals, a first gain adjustment amount may be selected. A second, different, gain adjustment amount may be selected if any of the communication conditions change.

Figure 4A:
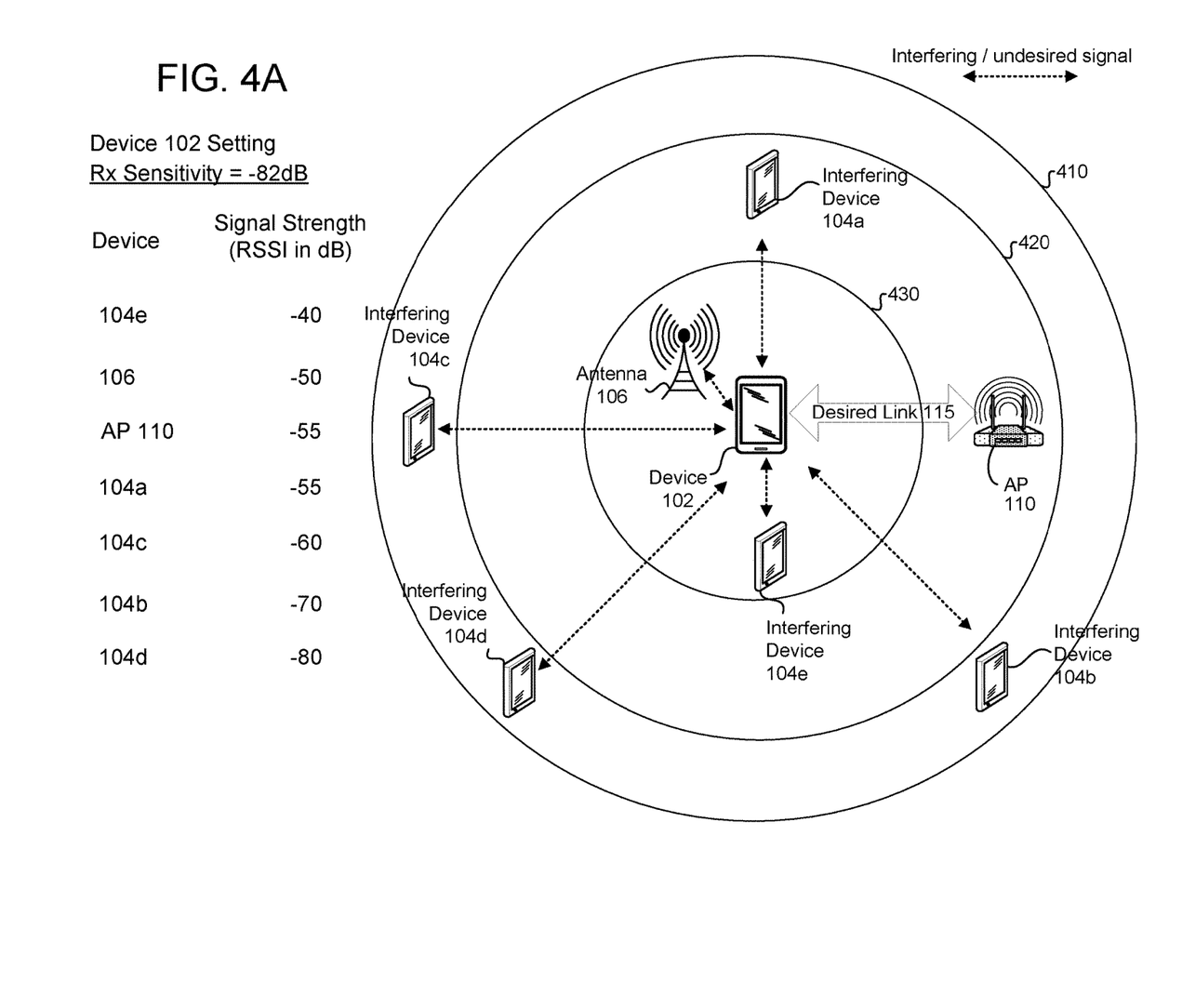
FIGS. 4A-4C illustrate the impact of receive sensitivity on detected signals from neighboring devices according to embodiments of the present disclosure.
Figure 4B:
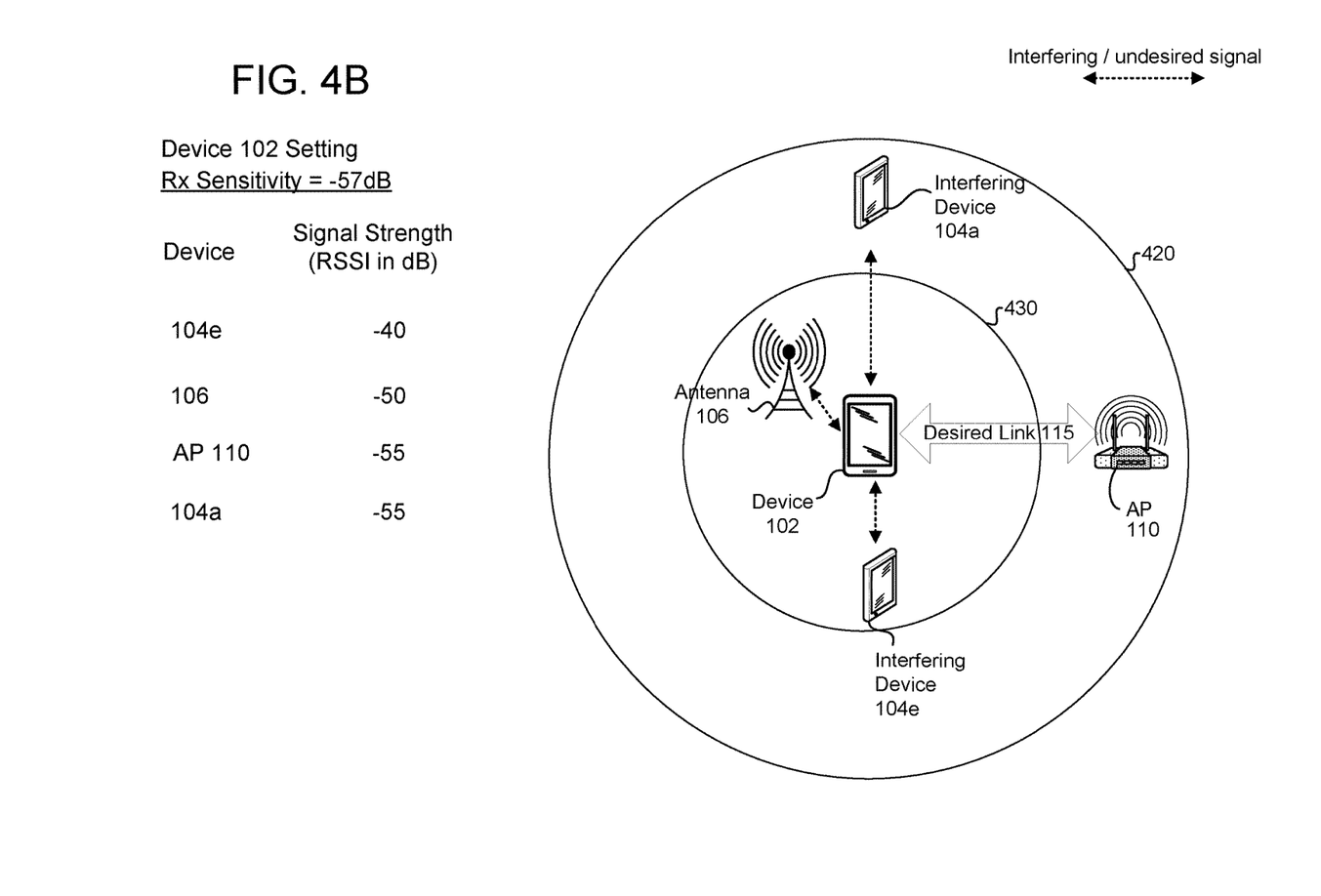
Figure 4C:
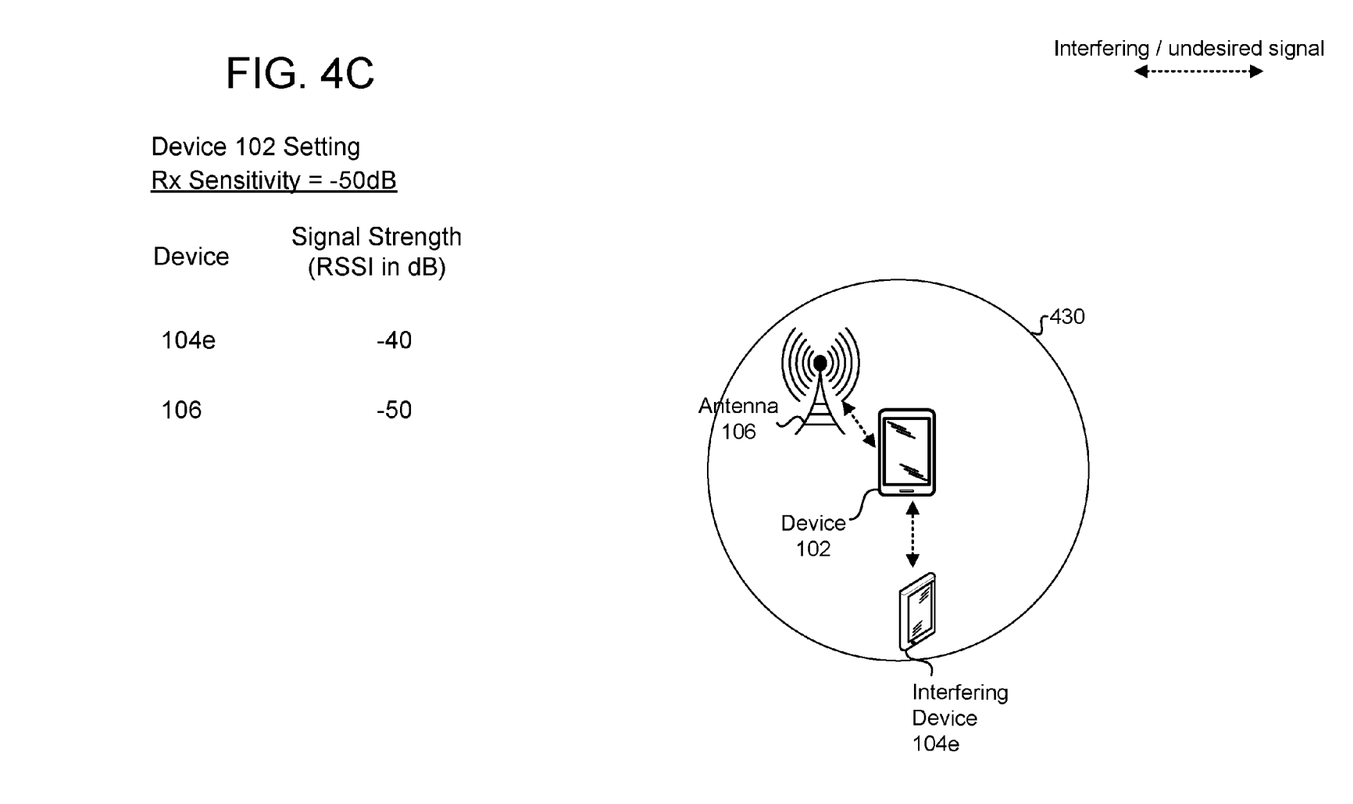

With the Rx sensitivity reduced, the device 102 should reduce the number of interfering signals detected. As can be appreciated, however, the device 102 may be configured to avoid reducing the Rx sensitivity so far as to impact the desired communication link 115. For example, as illustrated in FIG. 4A, the device at a first Rx sensitivity, −82 dB (the range of which is illustrated by circle 410) may detect a first number of signals, only one of which is for the desired link 115. If the device 102 adjusts its Rx sensitivity to −57 dB (the range of which is illustrated by circle 420), it will no longer detect a number of the interfering devices. For example, as shown in FIG. 4A, at −82 dB Rx sensitivity the device 102 detects the AP 110 for the desired link 115 and interfering signals from antenna 106 and devices 104a-104e. As shown in FIG. 4B, at −57 dB the device detects the AP 110 for the desired link 115 but only interfering signals from antenna 106 and devices 104a and 104e, thus reducing the number of detected interfering signals. However, as illustrated in FIG. 4C, if the device 102 reduces its Rx sensitivity to −50 dB (the range of which is illustrated by circle 430), the device may only detect signals from antenna 106 and interfering device 104e, thus losing the desired link 115 to AP 110. Thus, the device 102 may be configured to only select a gain adjustment value that does not change the Rx sensitivity to a point where the desired link 115 may be dropped, or otherwise suffer significant communication performance degradation. For purposes of FIGS. 4A-4C, the circles 410, 420, and 430 are meant to be illustrative of a range of detectable devices in each of the Rx sensitivities. As can be appreciated, in addition to the respective distances from device 102, the respective transmit strengths of the different devices will also impact the relative received strength(s) at device 102. Other factors (such as environmental conditions) may also impact the relative received strength(s) at device 102.

Figure 5:
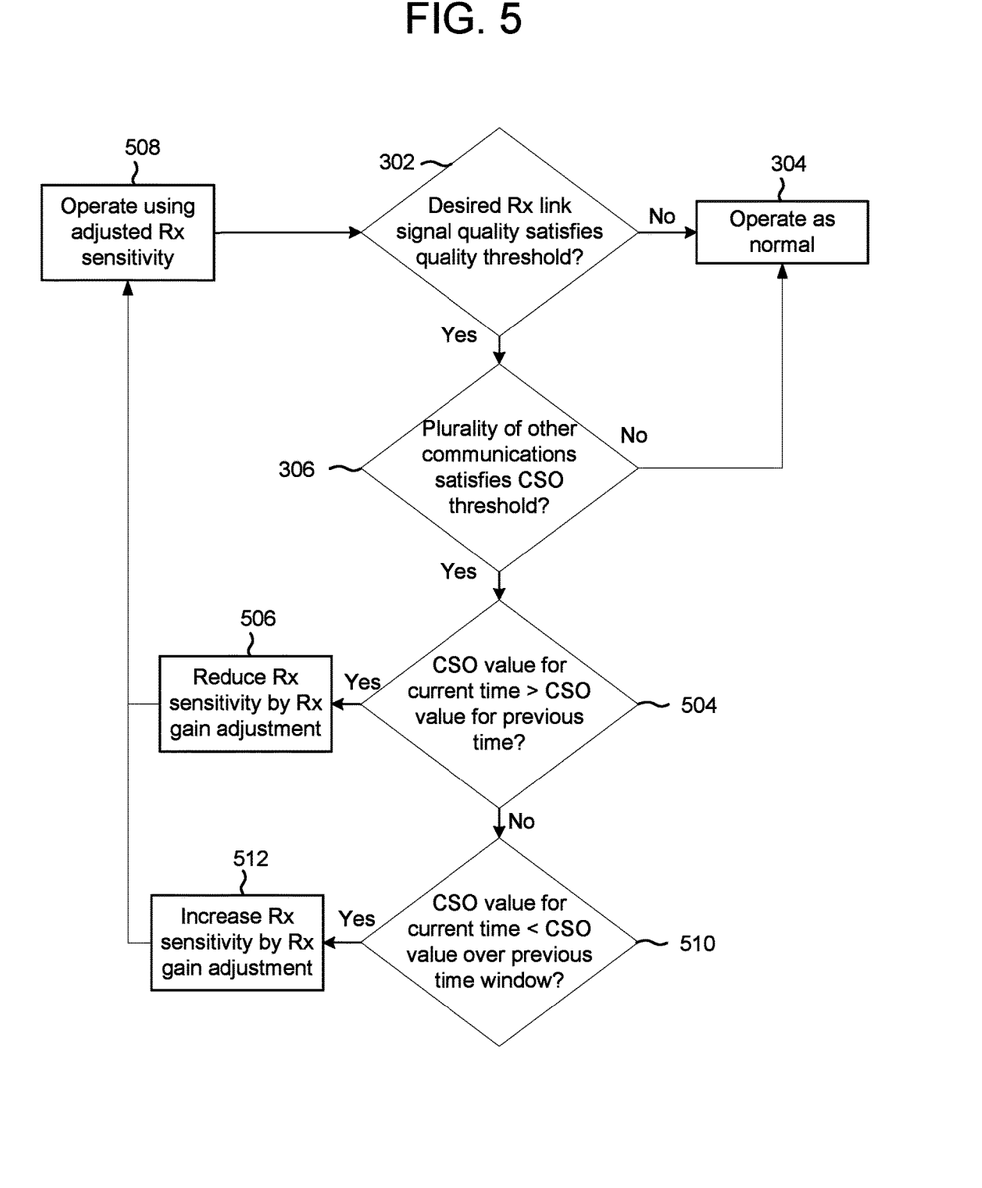
FIG. 5 illustrates a flowchart for dynamically adjusting a device's receive sensitivity according to embodiments of the present disclosure.

The device may also operate a loop or other check on communication conditions to raise or lower the gain dynamically as conditions dictate. Such a loop is illustrated in FIG. 5. As shown in FIG. 5, similar to as discussed in FIG. 3, a device may check (302) if a desired Rx link signal quality is sufficient (i.e., satisfies a threshold). If not (304: No), the device may operate (304) as normal. The device may also check (306) if a plurality of detected other signals (for example represented by a CSO counter value) satisfies a CSO threshold. If it does not (306:No) the device may also operate (304) as normal. If both conditions are satisfied (302:Yes and 306:Yes), however, the device may enter a dynamic gain adjustment process.

Rx sensitivity may be a function of CSO values, either at a moment in time or as the CSO values change over time. The relationship between Rx sensitivity and CSO value (which may depend on quantity of interfering signals and/or the strength of the interfering signals) may be linear or non-linear. Discussed below are specific examples of how Rx sensitivity may be adjusted based on changing CSO values, though many different such relationships and configurations are possible. As shown in 504, the device may check if a CSO value for a current time is greater than a CSO value for a previous time, thus showing channel conditions growing more crowded. This may be illustrated in Equation (3):

$$CSO_t > CSO_{t-1} \qquad (3)$$

The value of the time increments t may be configured by the system based on a number of factors including default settings, communication conditions, etc. For example, if communication conditions are changing rapidly, each t increment may be smaller than if communication conditions are relatively stable. Default increments (e.g., 1 second) may be configured and changed as desired. If Equation (3) is satisfied, or check 504 is satisfied using a different check (504), the device 102 may reduce (506) the Rx sensitivity by an Rx gain adjustment. Thus, the device 102 may adjust a receive gain ($G_{Rx}$) by a gain adjustment amount ($G_{Adj}$) as illustrated in Equation (4):

$$G_{Rx(second)} = G_{Rx(first)} - G_{Adj} \qquad (4)$$

Then the system may then operate 508 using the adjusted (second) Rx sensitivity (the second Rx sensitivity based on the second Rx gain) and repeat the loop.

To ensure the Rx sensitivity does not change to a point that will result in degradation of link 115, the device 102 may also check (510) the CSO value for a current time against CSO value(s) for a previous time window to determine if channel conditions are changing. For example, the device 102 may use a previous time window of 3 time increments (though this is configurable) and may check if the current CSO value is less than any of the 3 most recent CSO values as illustrated in Equation (5):

$$CSO_t < MIN(CSO_{t-1}, CSO_{t-2}, CSO_{t-3}) \qquad (5)$$

If Equation (5) is satisfied, the system may determine that channel conditions are improving (i.e. fewer CSOs have been detected at time t than at time t−1, t−2, or t−3) and may increase the Rx gain (thus allowing more headroom in case the link 115 fluctuates with its Rx quality). Although illustrated as reviewing three previous time windows, a different number of windows may be considered. Further, the CSOs over those windows may be considered in a different manner than expressed in Equation (5), for example by averaging, weighted averaging, etc. Many different ways of comparing a current CSO to previous CSO(s) are possible. Thus, if Equation (5) (or an alternate check) is satisfied, or the system otherwise determines that the CSO value is decreasing relative to a previous time window (510:Yes), the system may increase (512) the Rx sensitivity by an Rx gain adjustment. Thus, the device 102 may adjust a receive gain ($G_{Rx}$) by a gain adjustment amount ($G_{Adj}$) as illustrated in Equation (4):

$$G_{Rx(second)} = G_{Rx(first)} + G_{Adj} \tag{6}$$

Then the system may then operate 508 using the adjusted (second) Rx sensitivity (the second Rx sensitivity based on the second Rx gain) and repeat the loop.

The techniques described herein may be used for various wireless communication networks such as CDMA, TDMA, FDMA, OFDMA, SC-FDMA and other networks. The terms "network" and "system" are often used interchangeably. A CDMA network may implement a radio technology, such as Universal Terrestrial Radio Access (UTRA), Telecommunications Industry Association's (TIA's) CDMA2000®, and the like. The UTRA technology includes Wideband CDMA (WCDMA) and other variants of CDMA. The CDMA2000® technology includes the IS-2000, IS-95 and IS-856 standards from the Electronics Industry Alliance (EIA) and TIA. A TDMA network may implement a radio technology, such as Global System for Mobile Communications (GSM). An OFDMA network may implement a radio technology, such as Evolved UTRA (E-UTRA), Ultra Mobile Broadband (UMB), IEEE 802.11 (Wi-Fi), Wi-Fi Direct, IEEE 802.16 (WiMAX), IEEE 802.20, Flash-OFDMA, and the like. The UTRA and E-UTRA technologies are part of Universal Mobile Telecommunication System (UMTS). 3GPP Long Term Evolution (LTE) and LTE-Advanced (LTE-A) are newer releases of the UMTS that use E-UTRA. UTRA, E-UTRA, UMTS, LTE, LTE-A and GSM are described in documents from an organization called the "3rd Generation Partnership Project" (3GPP). CDMA2000® and UMB are described in documents from an organization called the "3rd Generation Partnership Project 2" (3GPP2). The techniques described herein may be used for the wireless networks and radio access technologies mentioned above, as well as other wireless networks and radio access technologies.

FIG. 6 illustrates a block diagram conceptually illustrating example components of a device 102 according to the present embodiments. The device 102 may include computer-readable and computer-executable instructions that reside in storage 608. The device 102 may be an electronic device capable of connecting to a wireless network. Examples of electronic devices may include computers (e.g., a desktop, a laptop, a server or the like), portable devices (e.g., a camera, smart phone, tablet or the like), media devices (e.g., televisions, video game consoles or the like), hubs (such as access points, routers, or other non-mobile devices that still may engage in wireless communications) or the like. The device 102 may also be a component of any of the abovementioned devices or systems.

As illustrated in FIG. 6, the device 102 may include an address/data bus 602 for conveying data among components of the device 102. Each component within the device 102 may also be directly connected to other components in addition to (or instead of) being connected to other components across the bus 602.

The device 102 may include one or more controllers/processors 604 comprising one-or-more central processing units (CPUs) for processing data and computer-readable instructions and a memory 606 for storing data and instructions. The memory 606 may include volatile random access memory (RAM), non-volatile read only memory (ROM), non-volatile magnetoresistive (MRAM) and/or other types of memory. The device 102 may also include a data storage component 608 for storing data and processor-executable instructions. The data storage component 608 may include one or more non-volatile storage types such as magnetic storage, optical storage, solid-state storage, etc. The device 102 may also be connected to a removable or external non-volatile memory and/or storage (such as a removable memory card, memory key drive, networked storage, etc.) through the input/output device interfaces 610.

The device 102 includes input/output device interfaces 610. The input/output device interfaces may communicate to antenna 630 through transceiver 618. The transceiver 618 may include a number of components (not illustrated) such as one or more automatic gain controller (AGC), low noise amplifier, a baseband amplifier, a radio frequency (RF) amplifier, a digital amplifier, a number of different mixers (LNA, baseband, RF, etc.) or other components known in the art. The input/output device interfaces 610 may be configured to operate with a network 620, for example a wireless local area network (WLAN) (such as WiFi), Bluetooth, Zigbee and/or wireless networks, such as a Long Term Evolution (LTE) network, WiMAX network, 3G network, etc. The network 620 may include a local or private network or may include a wide network such as the internet. Devices may be connected to the network 620 through a wireless connection. Link 115 may be across network 620.

The input/output device interfaces 610 may also include an interface for an external peripheral device connection such as universal serial bus (USB), FireWire, Thunderbolt, Ethernet port or other connection protocol that may connect to networks 620.

The device may include I/O components such as a display 612, touch interface 614 or other components such as a keyboard, mouse, microphone, speaker, or the like (not shown).

The device may also include positioning components such as a global positioning system (GPS) component 642 which may calculate a global position of the device 102. The device may also include motion sensor components 644, which may include sensors such as an accelerometer, gyroscope, or the like.

The device 102 further includes a receive (Rx) sensitivity adjustment module 620, which may include a signal quality measurement module 622 and an interfering communication monitoring module 624. The Rx sensitivity adjustment module 620 may comprise processor-executable instructions stored in storage 608 to be executed by controller(s)/processor(s) 604 (e.g., software, firmware), hardware, or some combination thereof. For example, components of the Rx sensitivity adjustment module 620 may be part of a software application running in the foreground and/or background on the device 102. The Rx sensitivity adjustment module 620 may control the device 102 as discussed above, for example with regard to FIGS. 1, 2, 3, and 5. Some or all of the controllers/modules of the sensitivity adjustment module 620 may be executable instructions that may be embedded in hardware or firmware in addition to, or instead of, software. In one embodiment, the computing device 102 may operate using an Android operating system (such as Android 4.3 Jelly Bean, Android 4.4 KitKat or the like).

Executable computer instructions for operating the device 102 and its various components may be executed by the controller(s)/processor(s) 604, using the memory 606 as temporary "working" storage at runtime. The executable instructions may be stored in a non-transitory manner in non-volatile memory 606, storage 608, or an external device. Alternatively, some or all of the executable instructions may be embedded in hardware or firmware in addition to or instead of software.

The concepts disclosed herein may be applied within a number of different devices and computer systems, including, for example, general-purpose computing systems, server-client computing systems, mainframe computing systems, telephone computing systems, laptop computers, cellular phones, personal digital assistants (PDAs), tablet computers, speech processing systems, remote controls, distributed computing environments, etc. Thus the modules, components and/or processes described above may be combined or rearranged without departing from the scope of the present disclosure. The functionality of any module described above may be allocated among multiple modules, or combined with a different module. As discussed above, any or all of the modules may be embodied in one or more general-purpose microprocessors, or in one or more special-purpose digital signal processors or other dedicated microprocessing hardware. One or more modules may also be embodied in software implemented by a processing unit. Further, one or more of the modules may be omitted from the processes entirely.

The above embodiments of the present disclosure are meant to be illustrative. They were chosen to explain the principles and application of the disclosure and are not intended to be exhaustive or to limit the disclosure. Many modifications and variations of the disclosed embodiments may be apparent to those of skill in the art. Persons having ordinary skill in the field of computers and/or digital imaging should recognize that components and process steps described herein may be interchangeable with other components or steps, or combinations of components or steps, and still achieve the benefits and advantages of the present disclosure. Moreover, it should be apparent to one skilled in the art, that the disclosure may be practiced without some or all of the specific details and steps disclosed herein.

Embodiments of the disclosed system may be implemented as a computer method or as an article of manufacture such as a memory device or non-transitory computer readable storage medium. The computer readable storage medium may be readable by a computer and may comprise instructions for causing a computer or other device to perform processes described in the present disclosure. The computer readable storage medium may be implemented by a volatile computer memory, non-volatile computer memory, hard drive, solid-state memory, flash drive, removable disk and/or other media.

Embodiments of the present disclosure may be performed in different forms of software, firmware and/or hardware. Further, the teachings of the disclosure may be performed by an application specific integrated circuit (ASIC), field programmable gate array (FPGA), or other component, for example.

Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without author input or prompting, whether these features, elements and/or steps are included or are to be performed in any particular embodiment. The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list.

Conjunctive language such as the phrase "at least one of X, Y and Z," unless specifically stated otherwise, is to be understood with the context as used in general to convey that an item, term, etc. may be either X, Y, or Z, or a combination thereof. Thus, such conjunctive language is not generally intended to imply that certain embodiments require at least one of X, at least one of Y and at least one of Z to each is present.

As used in this disclosure, the term "a" or "one" may include one or more items unless specifically stated otherwise. Further, the phrase "based on" is intended to mean "based at least in part on" unless specifically stated otherwise.

What is claimed is:

1. A computer implemented method executable by a first device to filter potentially interfering wireless communications, the method comprising:
communicating with a second device using a communication link in a first frequency range and a first receive sensitivity of a receiver component of the first device;
detecting, three signals over a first period of time, the three signals comprising:
a first signal in the first frequency range sent from a third device,
a second signal in the first frequency range sent from a fourth device, and
a third signal in the first frequency range sent from a fifth device;
computing a quantity threshold based at least in part on a number of signals detected in a second period of time occurring prior to the first period of time;
determining that the three signals is above the quantity threshold;
creating a weighted first signal by applying, to the first signal, a first weight factor proportionate to a first signal strength of the first signal;
creating a weighted second signal by applying, to the second signal, a second weight factor proportionate to a second signal strength of the second signal;
creating a weighted third signal by applying, to the third signal, a third weight factor proportionate to a third signal strength of the third signal;
computing a signal strength threshold based at least in part on the weighted first signal, the weighted second signal, and the weighted third signal;
determining, over a third period of time, an average receive signal strength for signals received by the first device from the second device using the communications link;
determining that the average receive signal strength satisfies the signal strength threshold;
configuring the receiver component to have a second receive sensitivity that is lower than the first receive sensitivity by reducing a receive gain of the receiver component; and communicating with the second device using the communication link using the second receive sensitivity.

2. The computer implemented method of claim 1, wherein the receiver component comprises at least one of an automatic gain controller (AGC), low noise amplifier, a baseband amplifier, a radio frequency (RF) amplifier, a digital amplifier and a mixer.

3. The computer implemented method of claim 1, further comprising configuring the signal strength threshold by adding a pre-configured default receive detection setting to a signal headroom margin.

4. The computer implemented method of claim 1, further comprising:
detecting, over a fourth period of time, only the first signal;
determining that a number of signals detected over the fourth period of time is below the quantity threshold;
configuring the receiver component to have a third receive sensitivity by increasing the receive gain of the one receiver component, wherein the third receive sensitivity is lower than the first receive sensitivity but higher than the second receive sensitivity; and
communicating with the second device using the communication link, wherein the first device uses the third receive sensitivity.

5. A computer implemented method comprising:
communicating by a first device with a second device using a communication link, the first device using a first receive sensitivity;
detecting, by the first device during a first period of time, a first received signal that is not sent over the communication link and a second received signal that is not sent over the communication link;
creating, by the first device, a weighted first received signal by applying a first weight factor proportionate to a first signal strength of the first signal;
creating, by the first device, a weighted second received signal by applying a second weight factor proportionate to a second signal strength of the second signal;
computing, by the first device, a first threshold based at least in part on the weighted first received signal and the weighted second received signal;
detecting, by the first device during a second period of time, a third received signal that is not sent over the communication link and a fourth received signal that is not sent over the communication link;
determining, by the first device, that the third received signal and the fourth received signals satisfy the first threshold;
determining, by the first device, that a received signal quality, of a fourth received signal sent over the communication link, satisfies a second threshold;
configuring a second receive sensitivity, wherein the first receive sensitivity enables the first device to detect lower power signals than the second receive sensitivity; and
communicating with the second device using the communication link using the second receive sensitivity.

6. The computer implemented method of claim 5, further comprising determining the received signal quality by:
receiving, over a time period, a sixth received signal sent over the communication link and a seventh received signal sent over the communication link;
determining, for the sixth received signal, a first received signal strength indicator;
determining, for the seventh received signal, a second received signal strength indicator; and
determining the received signal quality using the first received signal strength indicator and the second received signal strength indicator.

7. The computer implemented method of claim 5, wherein the second threshold comprises a signal strength threshold for signals of the communication link.

8. The computer implemented method of claim 5, further comprising:
determining a received signal strength for the third received signal;
determining a second received signal strength for the fourth received signal; and
determining, using the first received signal strength and the second received signal strength, that the third received signal satisfies a third threshold and that the fourth received signal satisfies the third threshold.

9. The computer implemented method of claim 5, further comprising configuring the second threshold using a pre-configured default receive detection setting and a signal headroom margin.

10. The computer implemented method of claim 5, wherein configuring the second receive sensitivity comprises reducing a receive gain of at least one component of the first device, wherein the at least one component comprises at least one of an automatic gain controller (AGC), low noise amplifier, a baseband amplifier, a radio frequency (RF) amplifier, a digital amplifier and a mixer.

11. The computer implemented method of claim 5, wherein:
the communications link uses a first frequency range, and
detecting the third received signal and the fourth received signals comprises detecting received signals within the first frequency range that are not sent over the communication link.

12. The computer implemented method of claim 5, further comprising:
computing, by the first device, a third threshold based at least in part on the first signal strength and the second signal strength; and
determining, by the first device, that a third signal strength of the third received signal satisfies the third threshold and that a fourth signal strength of the fourth received signal satisfies the third threshold.

13. A computing device comprising:
at least one processor;
a memory including instructions operable to be executed by the at least one processor to configure the device to:
communicate by a first device with a second device using a communication link, the first device using a first receive sensitivity;
detect, by the first device during a first period of time, a first received signal that is not sent over the communication link and a second received signal that is not sent over the communication link;
create, by the first device, a weighted first received signal by applying a first weight factor proportionate to a first signal strength of the first signal;
create, by the first device, a weighted second received signal by applying a second weight factor proportionate to a second signal strength of the second signal;
compute, by the first device, a first threshold based at least in part on the weighted first received signal and the weighted second received signal;
detect, by the first device during a second period of time, a third received signal that is not sent over the communication link and a fourth received signal that is not sent over the communication link;

determine, by the first device, that the third received signal and the fourth received signal satisfy the first threshold;

determine, by the first device, that a received signal quality, of a fourth received signal sent over the communication link, satisfies a second threshold;

configure a second receive sensitivity, wherein the first receive sensitivity enables the first device to detect lower power signals than the second receive sensitivity; and communicate with the second device using the communication link using the second receive sensitivity.

14. The computing device of claim 13, wherein the instructions to determine the received signal quality comprise instructions to:

receive over a time period, a sixth received signal sent over the communication link and a seventh received signal sent over the communication link;

determine, for the sixth received signal, a first received signal strength indicator;

determine, for the seventh received signal, a second received signal strength indicator; and determine the received signal quality using the first received signal strength indicator and the second received signal strength indicator.

15. The computing device of claim 13, wherein the second threshold comprises a signal strength threshold for signals of the communication link.

16. The computing device of claim 13, wherein the instructions further configure the device to:

determine a received signal strength for the third received signal;

determine a second received signal strength for the fourth received signal; and determine, using the first received signal strength and the second received signal strength, that the third received signal satisfies a third threshold and that the fourth received signal satisfies the third threshold.

17. The computing device of claim 13, wherein the instructions further configure the device to c the second threshold using a pre-configured default receive detection setting and a signal headroom margin.

18. The computing device of claim 13, wherein the instructions further configure the device to configure the second receive sensitivity comprises reducing a receive gain of at least one component of the first device, wherein the at least one component comprises at least one of an automatic gain controller (AGC), low noise amplifier, a baseband amplifier, a radio frequency (RF) amplifier, a digital amplifier and a mixer.

19. The computing device of claim 13, wherein:

the communications link uses a first frequency range, and the instructions further configure the device to detect the third received signal and the fourth received signal by detecting received signals within the first frequency range that are not sent over the communication link.

* * * * *